United States Patent
Miyoshi et al.

(10) Patent No.: US 8,026,718 B2
(45) Date of Patent: Sep. 27, 2011

(54) MAGNETIC SENSOR, HALL ELEMENT, HALL IC, MAGNETORESISTIVE EFFECT ELEMENT, METHOD OF FABRICATING HALL ELEMENT, AND METHOD OF FABRICATING MAGNETORESISTIVE EFFECT ELEMENT

(75) Inventors: Makoto Miyoshi, Nagoya (JP); Mitsuhiro Tanaka, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 442 days.

(21) Appl. No.: 12/193,851

(22) Filed: Aug. 19, 2008

(65) Prior Publication Data
US 2009/0058411 A1    Mar. 5, 2009

(30) Foreign Application Priority Data
Aug. 28, 2007    (JP) .................. 2007-220815
Jun. 26, 2008    (JP) .................. 2008-167455

(51) Int. Cl.
G01R 33/07    (2006.01)
(52) U.S. Cl. .................. 324/251; 324/207.2
(58) Field of Classification Search .............. 324/207.2, 324/251; 257/12, 101; 123/612, 617; 338/32 R, 338/32 H; 438/47
See application file for complete search history.

(56) References Cited

U.S. PATENT DOCUMENTS
2002/0011599 A1*  1/2002  Motoki et al. ............ 257/76
2007/0046287 A1*  3/2007  Vervaeke et al. ......... 324/251
2009/0321261 A1*  12/2009 Vlahovic et al. ......... 204/545

FOREIGN PATENT DOCUMENTS
JP    2002076024 A  *  3/2002
JP    2003-060255 A1    2/2003
JP    2005-035869 A1    2/2005
JP    2006-080338 A1    3/2006

OTHER PUBLICATIONS

Nobuaki Teraguchi, Partial-Machined Translation of JP2002074024A, Mar. 15, 2002.*
Ichiro Shibasaki, et al., "Magneto-Resistance Effect of Sn-Doped InSb Single Crystal Thin Films and Applications to Rotation Detection," IEEJ Transactions on Electrical and Electronic Engineering, SM, vol. 126, No. 8, (2006), pp. 445-452.
Ichiro Shibasaki, "Properties of InSb Thin Films Grown by Molecular Beam Epitaxy and Their Applications to Magnetic Field Sensors," IEEJ Transactions on Electrical and Electronic Engineering, SM, vol. 123, No. 3, (2003), pp. 69-78.

* cited by examiner

Primary Examiner — Bot Ledynh
(74) Attorney, Agent, or Firm — Burr & Brown

(57) ABSTRACT

An aspect of the present invention provides a magnetic sensor which is operated better at a high temperature range not lower than 300° C. compared with a conventional magnetic sensor. A operating layer having a heterojunction interface is formed by laminating a first layer made of GaN whose electron concentration is not more than $1 \times 10^{16}/cm^3$ at room temperature and a second layer made of $Al_xGa_{1-x}N$ ($0 < x \leq 0.3$). Therefore, in a two-dimensional electron gas region, carrier mobility is further enhanced while a carrier concentration is further lowered. Accordingly, there is realized a Hall element which can be used with measurement sensitivity similar to that at room temperature by constant-current drive even at a high temperature, while having the high measurement sensitivity in both the constant-current drive and constant-voltage drive at room temperature.

15 Claims, 10 Drawing Sheets

F I G . 1
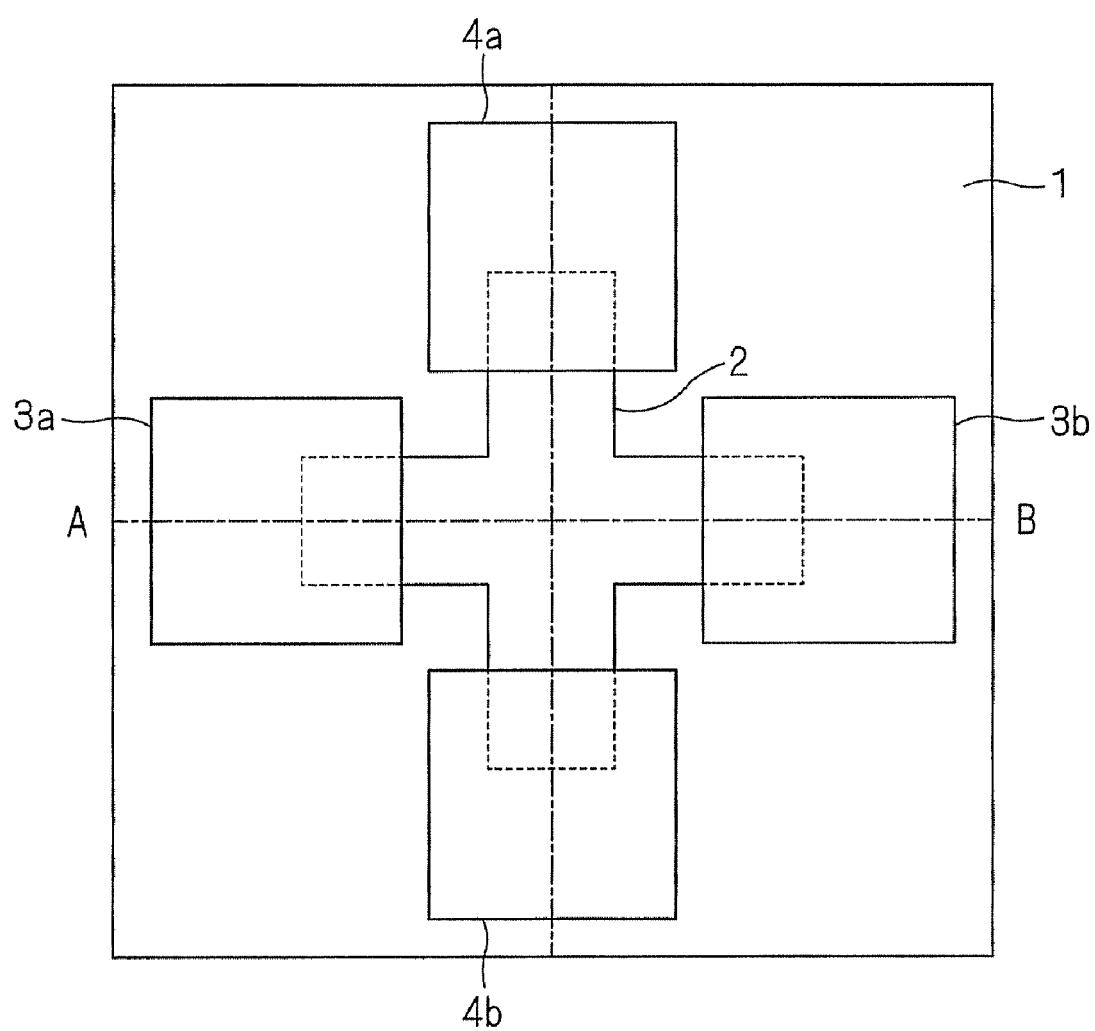

F I G. 6
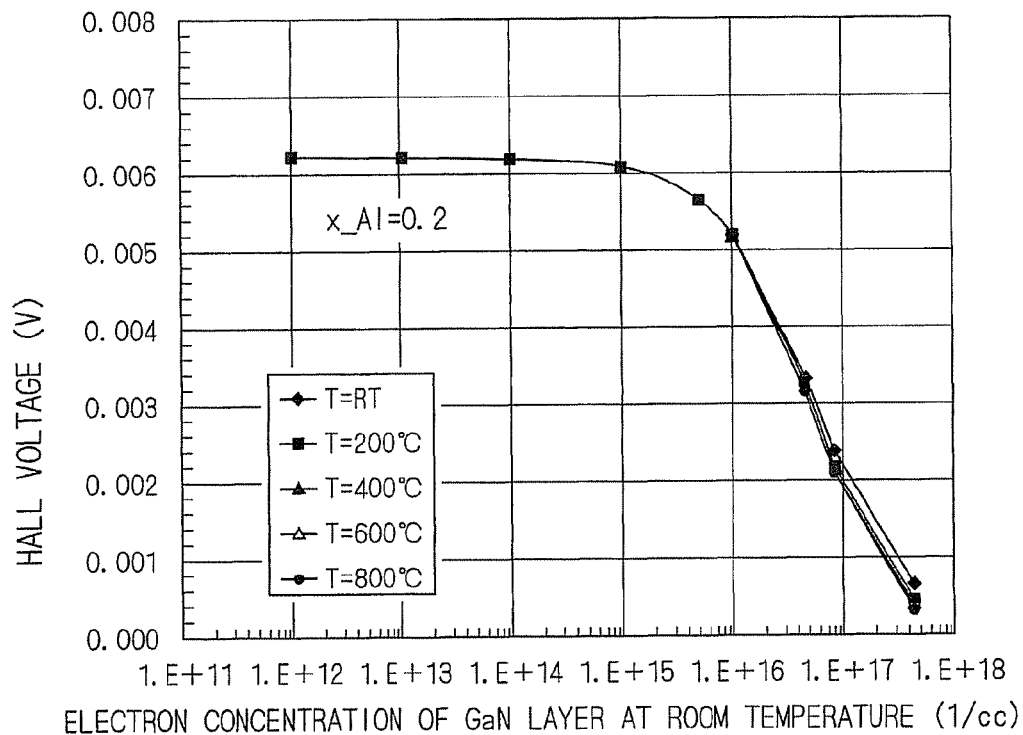
F I G. 7
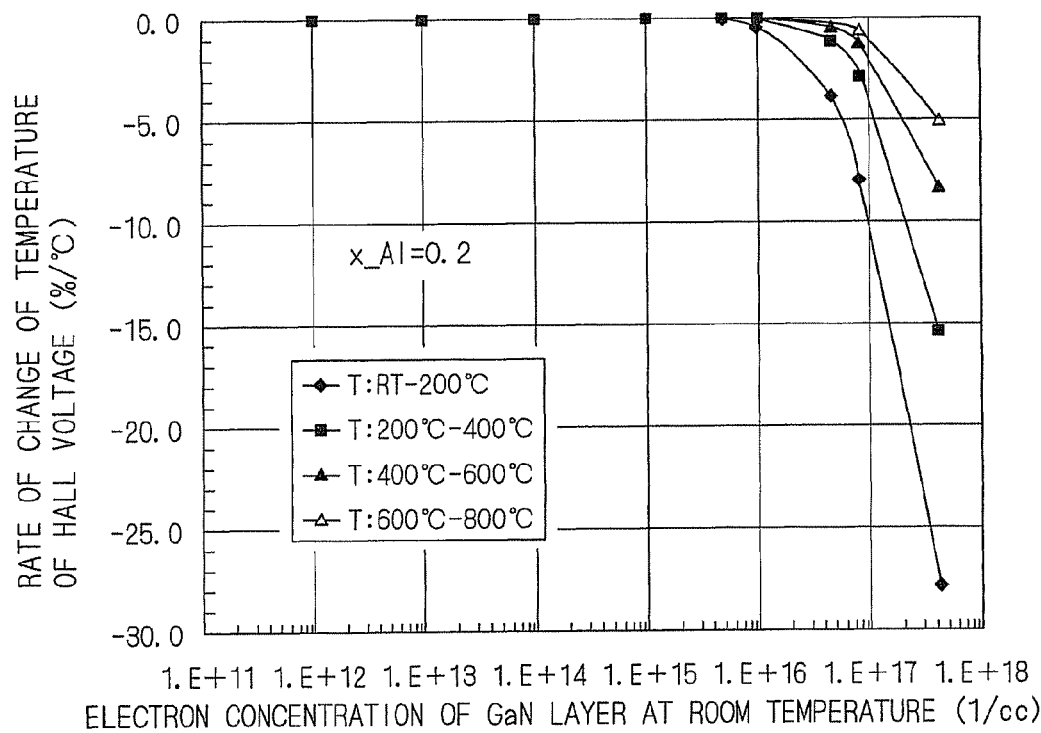

FIG. 17

| | SUPPLY GAS AND FLOW RATE FROM GROUP-III RAW-MATERIAL GAS SYSTEM | SUPPLY GAS AND FLOW RATE FROM GROUP-V RAW-MATERIAL GAS SYSTEM |
|---|---|---|
| THERMAL CLEANING | $H_2$:2m/sec | — |
| BUFFER LAYER FORMATION AT 500°C | TMG+$H_2$:2m/sec | $NH_3$+$H_2$:2m/sec |
| TEMPERATURE RISING TO 1000°C | $N_2$:2m/sec | $NH_3$+$N_2$:2m/sec |
| GaN LAYER FORMATION | TMG+$H_2$+$N_2$:4m/sec | $NH_3$+$H_2$+$N_2$:4m/sec |
| AlGaN LAYER FORMATION | TMA+TMG+$H_2$+$N_2$:4m/sec | $NH_3$+$H_2$+$N_2$:4m/sec |

MAGNETIC SENSOR, HALL ELEMENT, HALL IC, MAGNETORESISTIVE EFFECT ELEMENT, METHOD OF FABRICATING HALL ELEMENT, AND METHOD OF FABRICATING MAGNETORESISTIVE EFFECT ELEMENT

BACKGROUND OF THE INVENTION

1. Field of the Invention

The present invention relates to a magnetic sensor whose operating layer is made of a group-III nitride semiconductor.

2. Description of the Background Art

It is known that magnetic sensors such as a Hall element and a magnetoresistive effect element whose operating layer is made of a semiconductor material exhibit higher sensitivity with increasing carrier mobility of the semiconductor material used. Therefore, conventionally compound semiconductors such as InSb and InAs which exhibit high electron mobility have been used for the operating layer of the magnetic sensor (refer to, e.g., "Physical properties of InSb single-crystal thin film and magnetic sensor application", IEEJ Transactions on Electrical and Electronic Engineering E, Vol. 123, No. 3 (2003), pp. 69-78). For example, the Hall element in which Hall effect of a thin-film of InSb or InAs is utilized is extensively used as a magnetic sensor of DC brushless motor.

There is also known a magnetic sensor whose operating layer is made of a group-III nitride semiconductor having a wide bandgap (refer to, e.g., Japanese Patent Application Laid-Open Nos. 2003-060255 and 2006-080338). This magnetic sensor has an advantage that a characteristic change is hardly generated even at a high temperature although it is inferior in the carrier mobility and sensitivity to the magnetic sensor for which InSb or InAs is used. Particularly, Japanese Patent Application Laid-Open No. 2006-080338 discloses that a magnetic sensor whose operating layer having an $Al_xGa_{1-x}N/GaN$ ($0.3<x\leqq0.5$) heterostructure can well operated at 300° C. or more (in a range of 0° C. to 800° C.).

There is also known a technique of suitably controlling a donor concentration in forming an N-type group-III nitride semiconductor layer (refer to, e.g., Japanese Patent Application Laid-Open No. 2005-035869).

As described in Japanese Patent Application Laid-Open No. 2003-060255, in the case of the magnetic sensor for which InSb or InAs is used, there is widely known a drawback that the magnetic sensor cannot be used at a high temperature because of temperature dependence of a Hall voltage measured under a condition of constant magnetic flux density.

Japanese Patent Application Laid-Open No. 2003-060255 specifically discloses only the fact that the magnetic sensor whose operating layer is made of the group-III nitride semiconductor operates in a temperature range not more than 200° C. There is disclosed no specific fact that the magnetic sensor functions well at a high temperature range not lower than 300° C. or no requirement to realize the magnetic sensor well operated in the high temperature range not lower than 300° C. That is, Japanese Patent Application Laid-Open No. 2003-060255 does not disclose the magnetic sensor well operated in the high temperature range not lower than 300° C. The same holds true for Japanese Patent Application Laid-Open No. 2006-080338.

On the other hand, in Japanese Patent Application Laid-Open No. 2006-080338, a range of $x\leqq0.3$ is excluded in the $Al_xGa_{1-x}N/GaN$ heterostructure constituting the operating layer of the magnetic sensor. For the case of the $Al_xGa_{1-x}N/GaN$ heterostructure, because the electron mobility in the range of $x\leqq0.3$ is larger than that in the range of $0.3<x\leqq0.5$, the higher-sensitivity magnetic sensor which is well operated at 300° C. or more is realized if the range of $x\leqq0.3$ is utilized.

SUMMARY OF THE INVENTION

The present invention relates to a magnetic sensor whose operating layer is made of a group-III nitride semiconductor and a device to which the magnetic sensor is applied.

In the present invention, a magnetic sensor includes a GaN layer whose electron concentration is not more than $1\times10^{16}/cm^3$; and an AlGaN layer which is formed by $Al_xGa_{1-x}N$ ($0<x\leqq0.3$), wherein the GaN layer and the AlGaN layer constitute an operating layer having a heterojunction structure.

Thus, there is realized the magnetic sensor which is operated with the substantially same measurement sensitivity from a room temperature to a high temperature.

In the present invention, a Hall element comprises, in addition to the components of the magnetic sensor described above, two input electrodes; and two output electrodes, wherein the two input electrodes are comprised on each of first end portions of the operating layer, the first end portions being opposite to each other when the operating layer is viewed from above, and the two output electrodes are comprised on each of second end portions of the operating layer, the second end portions being opposite to each other in a direction substantially orthogonal to a direction connecting each of the first end portions.

Thus, there is realized the Hall element which can be used with the measurement sensitivity similar to that at room temperature by the constant-current drive even at a high temperature, while having the high measurement sensitivity in both the constant-current drive and the constant-voltage drive at room temperature.

In the present invention, a magnetoresistive effect element comprises, in addition to the components of the magnetic sensor described above, two terminal electrodes; and a plurality of short-circuit electrodes, wherein the two terminal electrodes are comprised on end portions being opposite to each other on a surface of the operating layer, and the plurality of short-circuit electrodes are comprised between the two terminal electrodes.

Thus, there is realized the magnetoresistive effect element which is operated with the substantially same measurement sensitivity from a room temperature to a high temperature.

Accordingly, an object of the present invention is to provide a magnetic sensor which is operated better than that of the conventional magnetic sensor in the high temperature range not lower than 300° C.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a top view showing a Hall element 10 according to a first embodiment of the present invention;

FIGS. 6 to 11 are graphs showing a relationship between the configuration of the operating layer 2 and a change in temperature environment;

FIG. 17 is a view showing a list of a kind of supply gas and a flow rate in a group-III raw-material gas supply system and a group-V raw-material gas supply system when the laminated structure 5 is formed in Example 1.

DESCRIPTION OF THE PREFERRED EMBODIMENTS

First Embodiment

A Hall element which is of a magnetic sensor being able to detect a magnetic field by utilizing a semiconductor Hall effect will be described in a first embodiment.
(Outline of Hall Element)

Figure 2:
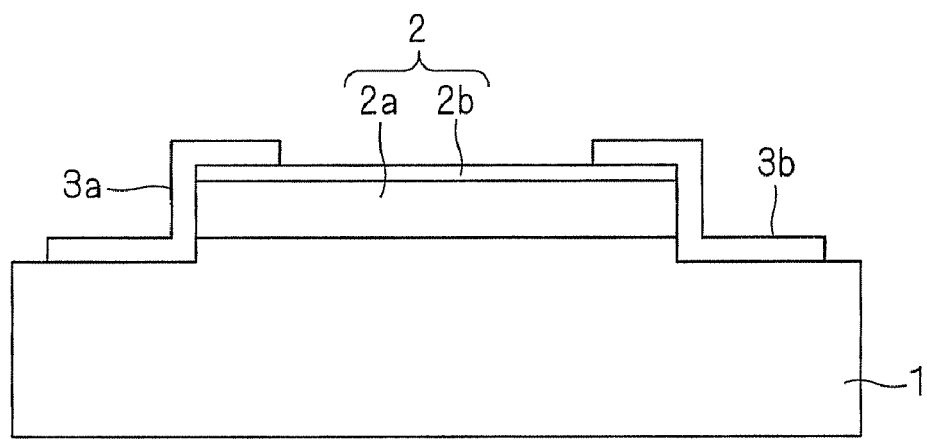
FIG. 2 is a sectional view showing the Hall element 10 in a section A-B of FIG. 1.

FIG. 1 is a top view showing a Hall element 10 according to the first embodiment of the present invention. FIG. 2 is a sectional view showing the Hall element 10 in a section A-B (passing through a substantially central portion) of FIG. 1.

In the Hall element 10, an operating layer 2, two input electrodes 3a and 3b, and two output electrodes 4a and 4b are provided on a substrate 1. The operating layer 2 is formed so as to have a cross shape in a central portion thereof when the Hall element 10 is viewed from above. Preferably each line of the cross shape is formed with a width of tens micrometers and a length of hundreds micrometers. For example, the width is set at 50 μm and the length is set at 200 μm.

The two input electrodes 3a and 3b are provided on front-end portions opposite to each other in the cross shape of the operating layer 2 such that the front-end portions are coated therewith. The two output electrodes 4a and 4b are provided on front-end portions, which are different from those of the input electrodes, opposite to each other in the cross shape of the operating layer 2 such that the front-end portions are coated therewith.

When a constant current is passed (in the case of constant-current drive) between the two input electrodes 3a and 3b or a constant voltage is applied (in the case of constant-voltage drive) between them while the Hall element 10 is placed in a perpendicular magnetic field from a surface toward a backside of the Hall element 10, a potential difference (Hall voltage) is generated between the two output electrodes 4a and 4b by a Hall effect of the operating layer 2. With the measurement of the Hall voltage, magnetic flux density of the magnetic field can be obtained as a value proportional to the Hall voltage (under the condition of the constant temperature).

Figure 3:
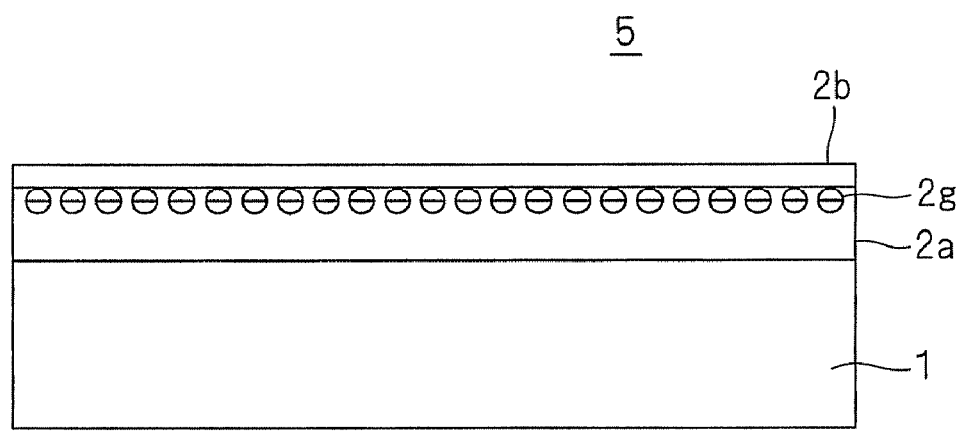
FIG. 3 is a schematic sectional view showing a laminated structure 5 used to form the Hall element 10.

FIG. 3 is a schematic sectional view showing a laminated structure 5 used to form the Hall element 10. In the laminated structure 5, the operating layer 2 is formed on the substrate 1 by epitaxial growth. The operating layer 2 has a structure in which a first layer 2a and a second layer 2b are laminated. Preferably a buffer layer (low-temperature buffer layer, not shown) made of GaN having a thickness of tens nanometers is provided between the substrate 1 and the operating layer 2a in order to improve crystal quality of the operating layers 2a and 2b.

Roughly, the Hall element 10 of the first embodiment is fabricated by following manner: the laminated structure 5 is obtained by the epitaxial growth of the operating layer 2 on the substrate 1, the operating layer 2 is removed using photolithography process and an RIE (Reactive Ion Etching) technique such that the cross shape remains in the central portion of the operating layer 2 when the Hall element 10 is viewed from above as shown in FIG. 1, then, the input electrodes 3a and 3b and the two output electrodes 4a and 4b are formed with the photolithography process and an EB (Electron Beam) evaporation technique. FIG. 2 shows the Hall element 10 in the case where the substrate 1 is partially removed by performing etching deeper than the thickness of the operating layer 2 when the operating layer 2 is formed into the cross shape with the RIE technique.

For example, a single-crystal sapphire substrate having a plane orientation (0001) is suitably used as the substrate 1. However, there is no particular limitation to the material of the substrate 1 as long as the operating layer 2 having a good crystal property can be formed. That is, the substrate 1 may be formed by appropriately selecting one from a group of sapphire, SiC, Si, GaAs, spinel, MgO, ZnO, ferrite, and the like.

The first layer 2a of the operating layer 2 is a semiconductor layer made of GaN which is one of the group-III nitride. The second layer 2b is a semiconductor layer made of AlGaN which is one of the group-III nitride. Preferably the first layer 2a is formed with the thickness of several micrometers. Preferably the second layer 2b is formed with the thickness of tens nanometers. The operating layer 2 is described in detail later.

It is a preferred example that the input electrodes 3a and 3b and the output electrodes 4a and 4b are provided as a multilayer electrode made of Ti/Al/Ni/Au.
(Relationship Between Configuration of Operating Layer and Hall Element Characteristic)

As described above, in the operating layer 2, a heterojunction interface is formed in a boundary between the first layer 2a and the second layer 2b because the first and second layers 2a and 2b made of the group-III nitrides having the different compositions and bandgaps are laminated. In the heterojunction interface, spontaneous polarization and piezo-polarization are generated thereby to form a two-dimensional electron gas region 2g where electrons are accumulated in high concentration at the first layer 2a with a range of several nanometers from the laminated interface between the first and second layers 2a and 2b. That is, a two-dimensional electron gas accumulated in the two-dimensional electron gas region 2g becomes a carrier, thereby realizing the operation of the Hall element 10.

However, for the Hall element whose operating layer is made of the semiconductor, in general, the more carrier mobility in the operating layer is increased, under the constant-voltage drive, or the more carrier concentration in the operating layer is decreased, under the constant-current drive, the more measurement sensitivity is enhanced (high Hall voltage is obtained). In the Hall element 10 of the first embodiment, the operating layer 2 is also formed so as to satisfy the requirements.

Specifically, the first layer 2a is formed such that the electron concentration is not more than $1 \times 10^{16}/cm^3$ at room temperature. The two-dimensional electron gas region 2g is further thinned (becomes more tow-dimensionally) by forming the first layer 2a in the above-described manner, whereby the carrier mobility is further enhanced in the two-dimensional electron gas region 2g.

Moreover, the second layer 2b is composed of an AlGaN layer having a small Al mixture proportion of $Al_xGa_{1-x}N$ ($0<x\leq0.3$). Therefore, a composition difference with the first layer 2a made of GaN becomes relatively small, generation of the two-dimensional electron gas is constrained in the two-dimensional electron gas region 2g, and therefore the carrier concentration is further reduced and the carrier mobility is improved.

The electron concentration of the first layer 2a is set at $1\times10^{16}/cm^3$ or less, and the three-dimensional electron transport in the first layer 2a is constrained by forming the second layer 2b as the AlGaN layer having the small Al mixture proportion, whereby the Hall element 10 has the high input/output resistance. This also contributes to the realization of the high measurement sensitivity.

Figure 4:
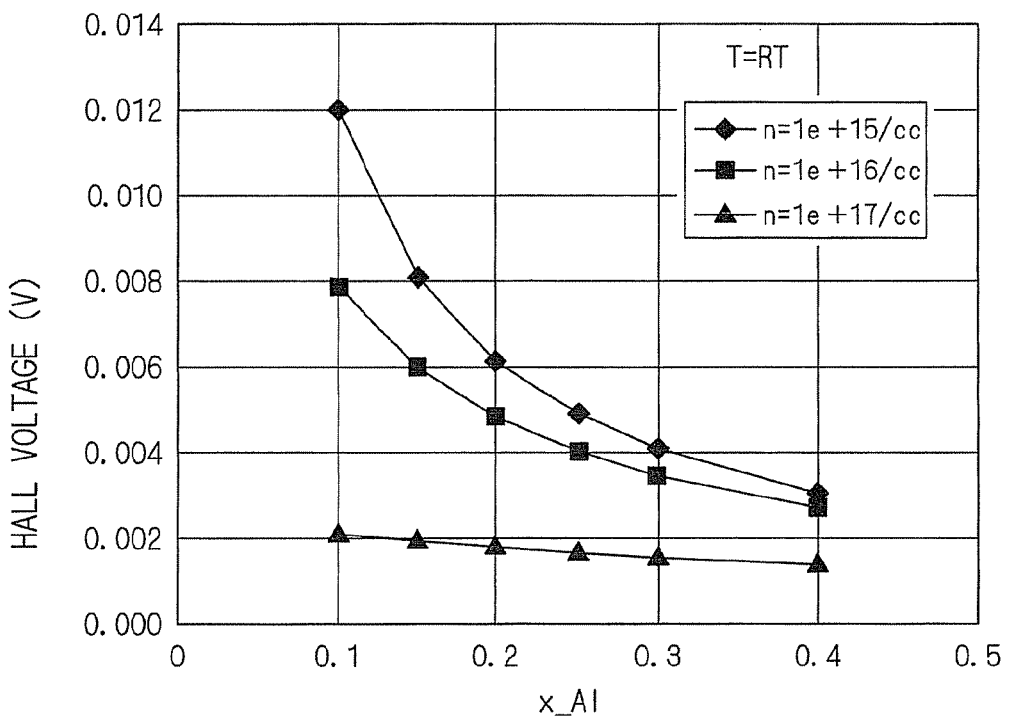
FIGS. 4 and 5 are graphs showing an effect based on a configuration of an operating layer 2.
Figure 5:
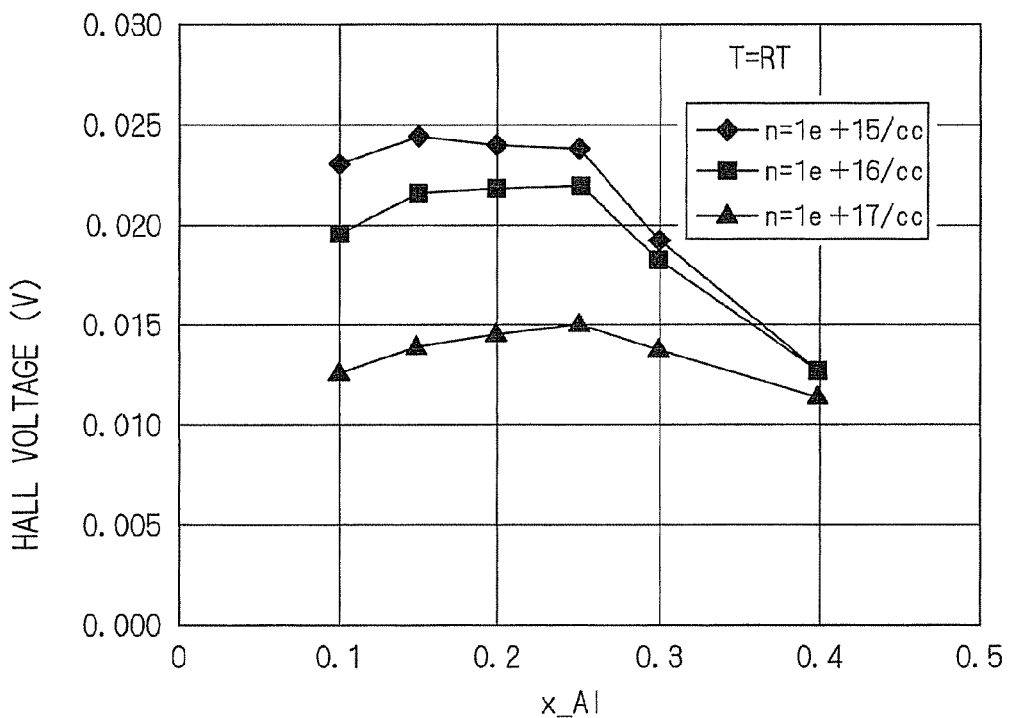

FIGS. 4 and 5 are graphs showing an effect based on such a configuration of the operating layer 2. FIG. 4 shows a relationship between an Al relative composition ratio x in all group-III elements (indicated by x_Al in FIG. 4) in the second layer 2b and a Hall voltage (unit: V), in the case where constant-current drive is performed to three kinds of Hall elements having different electron concentrations n (unit: $1/cc=1/cm^3$) in the first layer 2a at room temperature. The pieces of data shown in FIG. 4 are obtained by keeping the input current at 2 mA in the magnetic field whose magnetic flux density is 500 G (Gauss). FIG. 5 shows a relationship between an Al composition ratio x in all group-III elements (indicated by x_Al in FIG. 5) in the second layer 2b and a Hall voltage (unit: V), in the case where constant-voltage drive is performed to the Hall elements having different electron concentrations in the first layer 2a at room temperature. The pieces of data shown in FIG. 5 are obtained by keeping the input voltage at 3V in the magnetic field whose magnetic flux density is 500 G.

As can be seen from FIG. 4, the higher Hall voltage is obtained as the electron concentration in the first layer 2a is increased and as the Al composition ratio in all the group-III elements of the second layer 2b is decreased. As can be seen from FIG. 5, in the case where the electron concentration is not more than $1\times10^{16}/cm^3$ in the first layer 2a, the high Hall voltage is obtained when the Al composition ratio in all the group-III elements in the second layer 2b is not more than 0.3.

That is, the Hall element 10 with high measurement sensitivity while the measurement at room temperature in both the constant-current drive and the constant-voltage drive is realized by setting the electron concentration in the first layer 2a made of GaN at $1\times10^{16}/cm^3$ or less, and the Al composition proportion in all the group-III elements at 0.3 or less in the second layer 2b.

Next, a relationship between the configuration of the operating layer 2 and a temperature characteristic will be described below. The Hall element 10 of the first embodiment is operated, with the two-dimensional electron gas used as the carrier, and the constant-current drive is suitably adopted in the case where the Hall element 10 is used at a variable temperature environment. This is attributed to the following facts: In the case of the constant-current drive, the proportional relationship holds between the Hall voltage and the magnetic flux density while the inverse proportional relationship holds between the Hall voltage and the carrier concentration, and the concentration of the two-dimensional electron gas (that is, carrier concentration) hardly depends on the temperature change in principle. Therefore, even if the temperature environment is changed, the carrier concentration is kept constant, and the carrier concentration has no influence on the measurement sensitivity (The measured Hall voltage is not changed as long as the magnetic field condition is kept constant).

FIGS. 6 to 11 are graphs showing a relationship between a configuration of the operating layer 2 and a change in temperature environment.

FIG. 6 shows a relationship between the electron concentration (unit: $1/cc=1/cm^3$) in the first layer 2a (GaN layer) and the Hall voltage (unit: V) in the case where constant-current drive is performed at room temperature, 200° C., 400° C., 600° C., and 800° C. to various Hall elements whose second layers 2b are made of $Al_{0.2}Ga_{0.8}N$ (that is, in the case of x=0.2) while electron concentrations of the first layers 2a at room temperature differ from one another. The results are obtained by keeping the input current at 2 mA in the magnetic field whose magnetic flux density is 500 G.

FIG. 7 shows a relationship between the electron concentration in the first layer 2a and a rate of change of the Hall voltage between measurement temperatures (rate of change of temperature, unit: %/° C.), which are obtained from the measurement result of FIG. 6.

Figure 8:
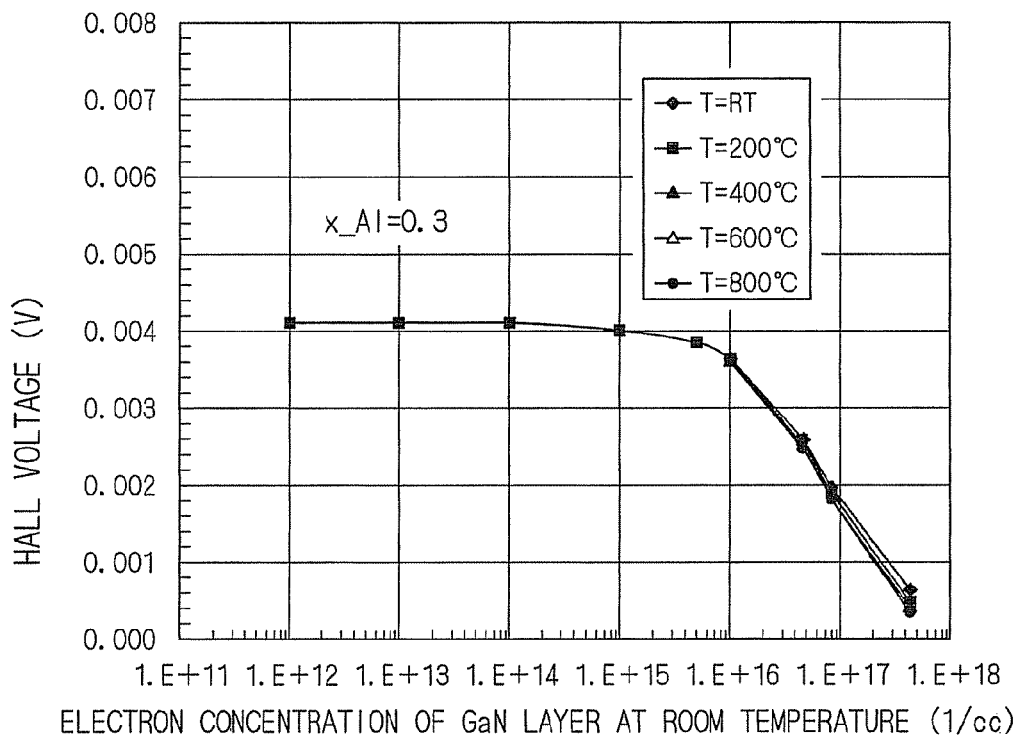

FIG. 8 shows a relationship between the electron concentration in the first layer 2a and the Hall voltage about the Hall element fabricated and referred to the measurement of the Hall voltage like the case for FIG. 6 except that the second layer 2b is made of $Al_{0.3}Ga_{0.7}N$ (that is, in the case of x=0.3).

Figure 9:
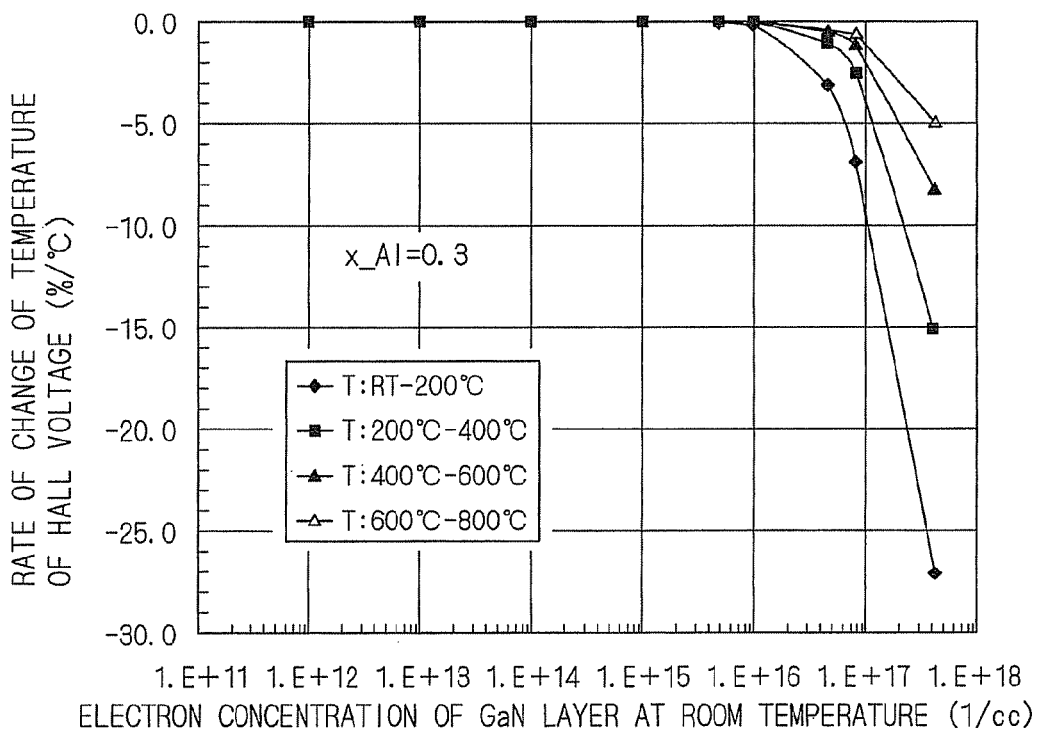

FIG. 9 shows a relationship between the electron concentration in the first layer 2a and the rate of change of temperature of the Hall voltage, which are obtained from the measurement result of FIG. 8.

Figure 10:
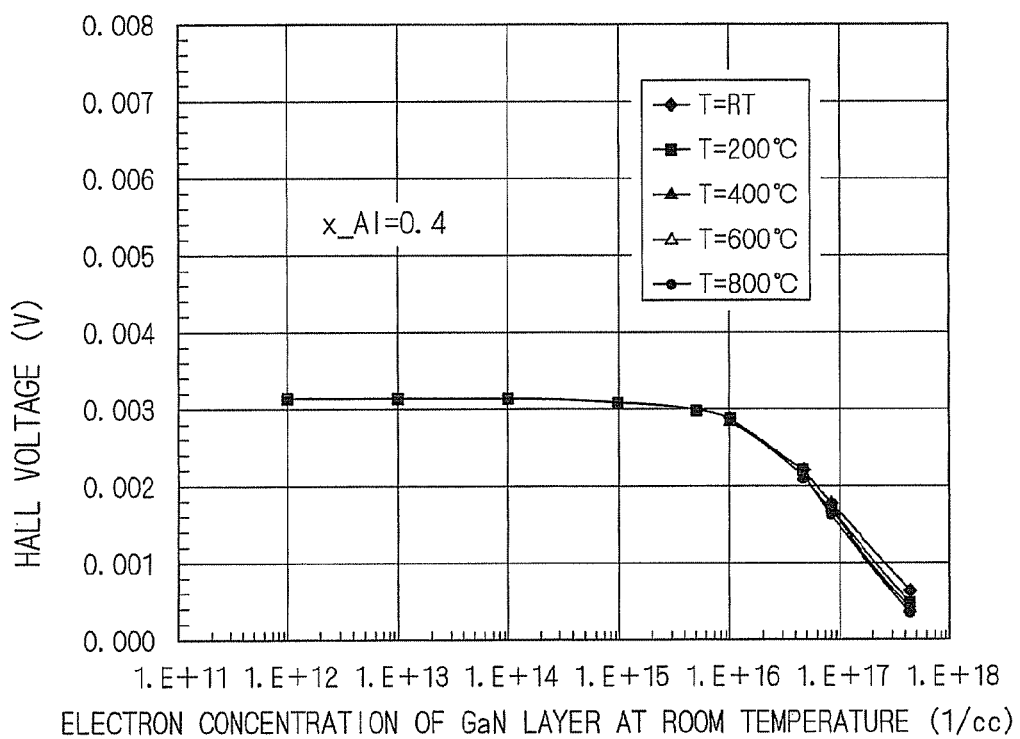

FIG. 10 shows a relationship between the electron concentration in the first layer 2a and the Hall voltage about the Hall element fabricated and referred to the measurement of the Hall voltage like the case for FIG. 6 except that the second layer 2b is made of $Al_{0.4}Ga_{0.6}N$ (that is, in the case of x=0.4).

Figure 11:
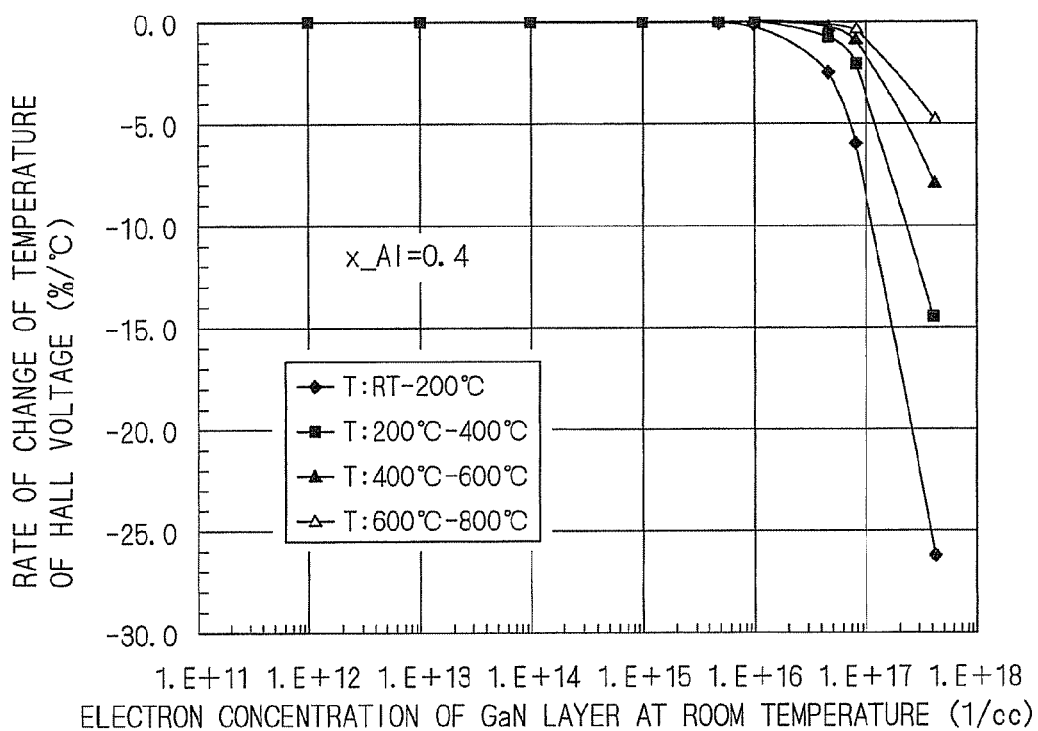

FIG. 11 shows a relationship between the electron concentration in the first layer 2a and the rate of change of temperature of the Hall voltage, which are obtained from the measurement result of FIG. 10.

As can be seen from FIGS. 6 to 11, in the case where the second layer 2b has the same composition, the Hall voltage is substantially kept constant irrespective of the temperature (the rate of change of temperature ranged from −0.01 to 0%/° C.) up to at least 800° C. as long as the Hall element 10 is fabricated such that the electron concentration in the first layer 2a is not more than $1\times10^{16}/cm^3$. The reason why the rate of change of temperature is increased at a high temperature in the Hall element whose first layer 2a has the high electron concentration is that a ratio of three-dimensionally distributed electrons is increased inside the first layer 2a except for the two-dimensional electron gas region 2g.

The results of FIGS. 6 to 11 show that the Hall element 10 having the operating layer 2 in which the first layer 2a made of GaN having the electron concentration of $1\times10^{16}/cm^3$ or less and the second layer 2b made of $Al_xGa_{1-x}N$ ($0<x\leq0.3$) are laminated realizes the stable constant-current drive operation in the temperature range from room temperature to 800° C. That is, the Hall element 10 of the first embodiment can be used with the good measurement sensitivity similar to that at room temperature by the constant-current drive even at not only room temperature but high temperature.

(Laminated Structure Forming Method)

A method of forming the laminated structure 5 to realize the operating layer 2 having the above-described configuration will be described below. The laminated structure 5 can be formed by an MOCVD technique. The substrate 1 is placed on a susceptor in a predetermined reaction tube, and the substrate 1 is heated to a predetermined reaction temperature (formation temperature). Then, while the reaction temperature is kept constant, a group-III raw-material gas (Ga raw-material gas in the case of the first layer 2a, and Ga raw-material gas and Al raw-material gas in the case of the second layer 2b) and a NH$_3$ gas which is of a group-V raw-material gas are caused to flow with predetermined flow rates along with a carrier gas respectively, which allows the first layer 2a and the second layer 2b to be sequentially deposited by the epitaxial growth. The first layer 2a is formed at a predetermined temperature in a range of 950° C. to 1200° C., for example, preferably the first layer 2a is formed at 1000° C. Similarly the second layer 2b is formed at a predetermined temperature in a range of 950° C. to 1200° C., for example, preferably the second layer 2b is formed at 1000° C. As described above, more preferably the first layer 2a and the second layer 2b are formed after the buffer layer made of GaN is previously formed on the substrate 1 at a predetermined temperature in a range of 400° C. to 600° C., for example, at 500° C.

The laminated structure 5 may be formed by an epitaxial growth technique except for the MOCVD technique, for example, a technique appropriately selected from a vapor phase growth technique or a liquid phase growth technique such as MBE, HVPE, and LPE or by a combination of different growth techniques as long as the electron concentration can be controlled in the first layer 2a or the composition proportion can be controlled in the second layer 2b.

Figure 12:
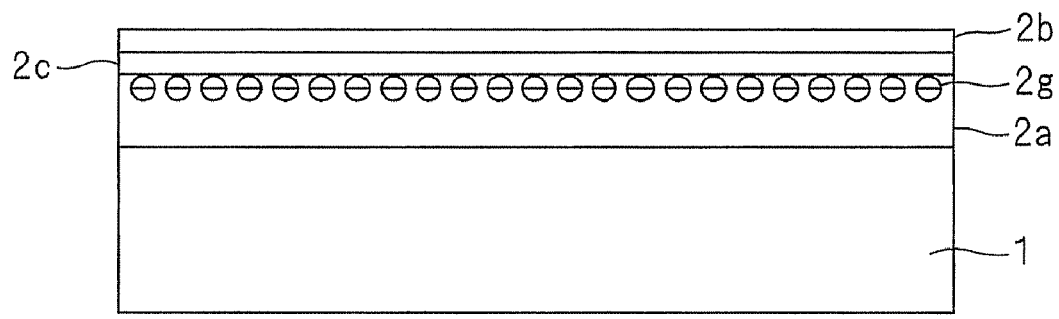
FIG. 12 is a schematic sectional view showing a laminated structure 15.

In order to further enhance the carrier mobility, an AlN layer may be inserted between the first layer 2a and the second layer 2b. FIG. 12 is a schematic sectional view showing the above-described configuration of the laminated structure 15. Preferably the AlN layer 2c is formed with the thickness of about 0.75 nm to about 1.5 nm. The Hall element 10 having the better measurement sensitivity can be realized in the case where a laminated structure 15 is used instead of the laminated structure 5.

Thus, the Hall element of the first embodiment includes the operating layer in which the layer made of GaN having the electron concentration of $1\times10^{16}/\text{cm}^3$ or less at room temperature and the layer made of Al$_x$Ga$_{1-x}$N (0<x≦0.3) are laminated. Therefore, there is realized the Hall element which can be used with the measurement sensitivity similar to that at room temperature by the constant-current drive even at a high temperature while having the high measurement sensitivity in both the constant-current drive and the constant-voltage drive at room temperature.

Second Embodiment (Outline of Hall Element)

As for the Hall element 10 shown in FIG. 2 of the first embodiment, when the operating layer 2 is formed into the cross shape with the RIE technique, a part of the substrate 1 is also removed by performing the etching deeper than the thickness of the operating layer 2. The way of forming the operating layer 2 into the cross shape is not limited to such manner. A Hall element including an operating layer in a different manner from the Hall element according to the first embodiment will be described in this embodiment.

Figure 13:
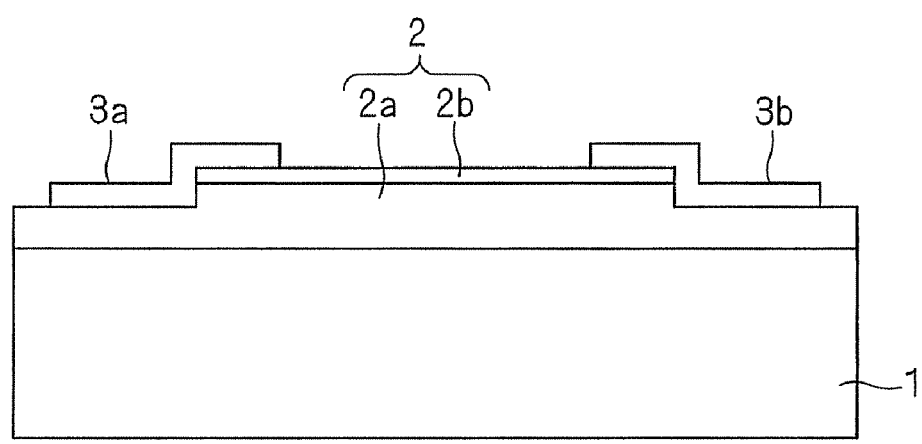
FIG. 13 is a sectional view showing a section passing through a substantially central portion of a Hall element 20 according to a second embodiment of the present invention.

FIG. 13 is a sectional view showing a section passing through a substantially central portion of a Hall element 20 according to the second embodiment. The Hall element 20 according to the second embodiment differs from the Hall element 10 according to the first embodiment in that the height of the cross-shape portion of the Hall element 20 is lower than that of the Hall element 10, although the Hall element 20 is identical to the Hall element 10 in that the operating layer 2 is formed so as to have the cross shape in the central portion thereof when viewed from above. The Hall element 20 having the above-described structure is realized by forming the cross shape in the central portion of the laminated structure 5 fabricated in the same way as the first embodiment, using the photolithography process and RIE (Reactive Ion Etching) technique, such that the etching depth of the etching region partitioning the cross-shape portion is smaller than the thickness of the operating layer 2. It is assumed that the etching depth is larger than the thickness of the second layer 2b. Preferably the etching depth of tens nanometers, for example, 60 nm is formed. However, as for the Hall element 20 according to this embodiment, when the laminated structure 5 is produced, the first layer 2a is formed as a high resistance layer whose specific resistance is not lower than $1\times10^6$ Ωcm (electron concentration is not more than $1\times10^{12}/\text{cm}^3$) at the fabrication of the laminated structure 5. Therefore, although the cross-shape portion is formed shallower, the electrical conduction is constrained except for the cross-shape portion in the operating layer 2, and the good measurement sensitivity is realized.

For example, in the Hall element 20, the GaN layer having the electron concentration of $5\times10^{11}/\text{cm}^3$ is formed as the first layer 2a with the thickness of 2 μm, the Al$_{0.2}$Ga$_{0.8}$N layer is formed as the second layer 2b with the thickness of 25 nm, and the etching depth is set at 60 nm in forming the operating layer 2. In this case, in the magnetic field whose magnetic flux density is 500 G, the Hall voltage of about 0.006V is obtained by the constant-current drive in which the input current is kept at 2 mA, and the Hall voltage of about 0.024V is obtained in the magnetic field whose magnetic flux density is 500 G by the constant-voltage drive in which the input voltage is kept at 3V. In the magnetic field whose magnetic flux density is 500 G, when the constant-current drive in which the input current is kept at 2 mA is performed while the Hall element 20 is heated from room temperature to 800° C., the rate of change of temperature 0.0005%/° C. is obtained from room temperature to 800° C.

This result represents that the Hall element not only having the high measurement sensitivity at room temperature in both the constant-current drive and the constant-voltage drive but operating even at a high temperature in the constant-current drive with measurement sensitivity similar to that at room temperature is realized by forming the operating layer so as to have the laminated structure of the high resistance layer made of GaN having the specific resistance of $1\times10^6$ Ωcm or more (electron concentration is not more than $1\times10^{12}/\text{cm}^3$) at room temperature and the layer made of Al$_x$Ga$_{1-x}$N (0<x≦0.3), even if the height of the cross-shape portion of the operating layer has as small as tens nanometers (the etching region partitioning the cross-shape portion is extremely shallow). The etching depth of just several tens nanometers signifies that the time and cost necessary to fabricate the Hall element are reduced compared with the fabrication of the Hall element 10 according to the first embodiment, in which the etching depth of several micrometers is required.

(High Resistance Layer Forming Method)

Next, the method of forming the first layer 2a as the high resistance layer in the process of obtaining the laminated structure 5, which is prepared for the fabrication of the Hall element 20 according to this embodiment, will be described below. It is assumed that the laminated structure 5 is obtained by the MOCVD technique in the same way as the first embodiment. In such cases, for example, the first layer 2a can be formed as the high resistance layer by a technique of controlling an atmosphere as disclosed in Japanese Patent Application Laid-Open No. 2005-035869. Specifically, a gas containing a nitrogen gas is caused to flow in heating the substrate 1 before the formation of the first layer 2a, and then, in at least one of the group-III raw-material carrier gas (first carrier gas) and the group-V raw-material carrier gas (second carrier gas), preferably in both the group-III raw-material carrier gas and the group-V raw-material carrier gas, a ratio of the nitrogen gas to the whole of each carrier gas is set at 3 volume percent or more for at least a period in forming the first layer 2a. Thus, the first layer 2a whose electron concentration is not more than $1 \times 10^{12}/cm^3$ (specific resistance is not lower than $1 \times 10^6$ Ωcm) is realized.

The nitrogen gas which is used as the first or second carrier gases in forming the subsequent first and second layers 2a and 2b may be supplied as the nitrogen gas supplied during the temperature rising. In such cases, preferably the gas containing the nitrogen gas is supplied from both the carrier gas supply sources.

In order to further increase the resistance of the first layer 2a, it is preferable that an initial stage of the formation of the first layer 2a (stage at which the thickness of the first layer 2a is not more than about 50 nm) is included in above-described at least the period in forming the first layer 2a.

On the other hand, in forming the first layer 2a after the initial stage of the formation, it is preferable that at least one of the first carrier gas and the second carrier gas, preferably both the first carrier gas and the second carrier gas substantially contains only hydrogen for the sake of further increasing of the resistance of the first layer 2a. As used herein, "substantially containing only hydrogen" shall mean a ratio of the hydrogen gas to the whole of each carrier gas is not lower than 99.99 at %.

The laminated structure 5 including the first layer 2a whose electron concentration is suitably controlled not more than $1 \times 10^{12}/cm^3$ can be obtained by adopting the above-described method.

Similarly to the first embodiment, the laminated structure 5 may be formed by an epitaxial growth technique except for the MOCVD technique, for example, a technique appropriately selected from a vapor phase growth technique or a liquid phase growth technique such as MBE, HVPE, and LPE or by a combination of different growth techniques as long as the electron concentration can be controlled in the first layer 2a or the composition proportion can be controlled in the second layer 2b.

As described above, according to this embodiment, the first layer of the operating layer is formed by the high-resistance GaN layer whose specific resistance is not lower than $1 \times 10^6$ Ωcm (electron concentration is not more than $1 \times 10^{12}/cm^3$) at room temperature, so that there is realized the Hall element having the element characteristic equal to that of the Hall element according to the first embodiment although the depth of the etching region partitioning the cross shape of the operating layer is as shallow as tens nanometers. According to the second embodiment, because the etching time necessary to form the cross-shape portion of the operating layer in fabricating the Hall element is sufficiently shorter than that for the Hall element according to the first embodiment, the Hall element having the higher fabrication efficiency and the reduced fabrication cost is realized compared with the Hall element according to the first embodiment.

Third Embodiment

The laminated structure 5 prepared for the fabrication of the Hall element 20 according to the second embodiment, which has the first layer 2a made of the high-resistance GaN layer whose specific resistance is not lower than $1 \times 10^6$ Ωcm (electron concentration is not more than $1 \times 10^{12}/cm^3$), suitably satisfies conditions to fabricate a high electron mobility transistor (HEMT) exhibiting a good pinch-off characteristic. Accordingly, by utilizing the laminated structure 5, a Hall IC in which the Hall element according to the second embodiment and an IC unit including HEMT are integrated can be realized. The Hall IC will be described in a third embodiment.

Figure 14:
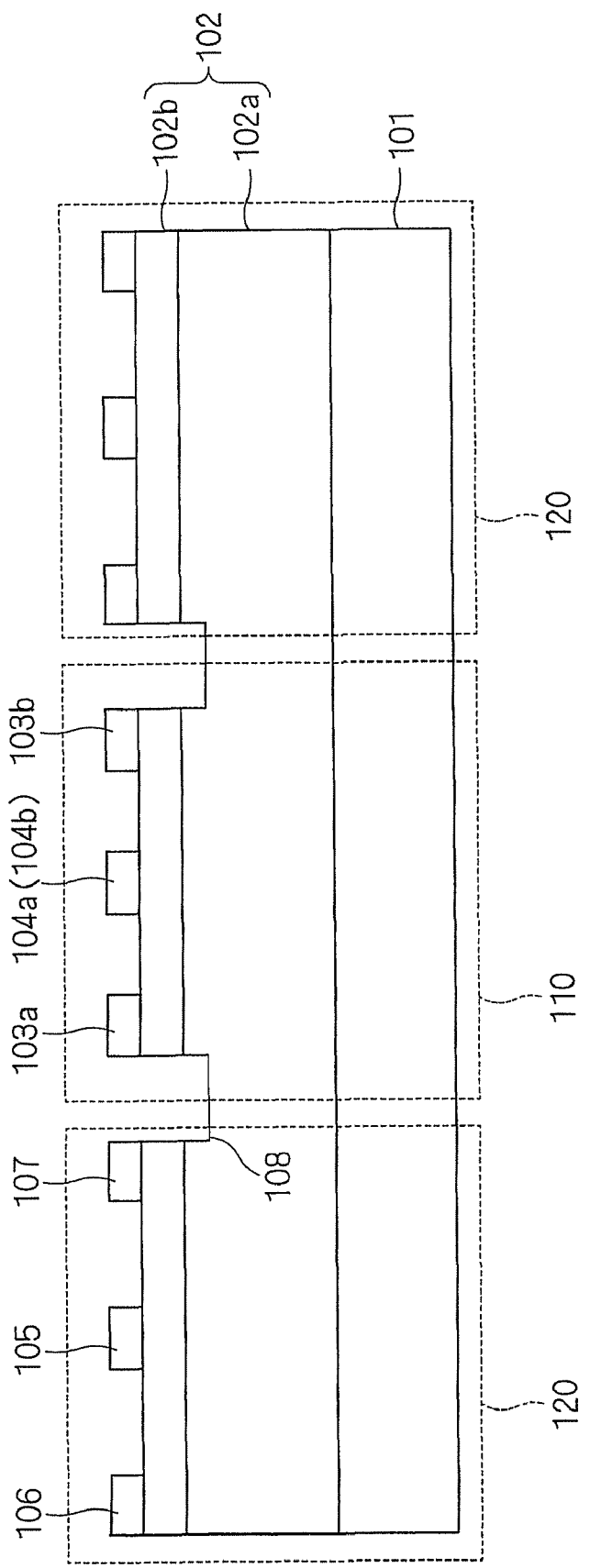
FIG. 14 is a side view showing a conceptual configuration of a Hall IC 100 according to a third embodiment of the present invention.
Figure 15:
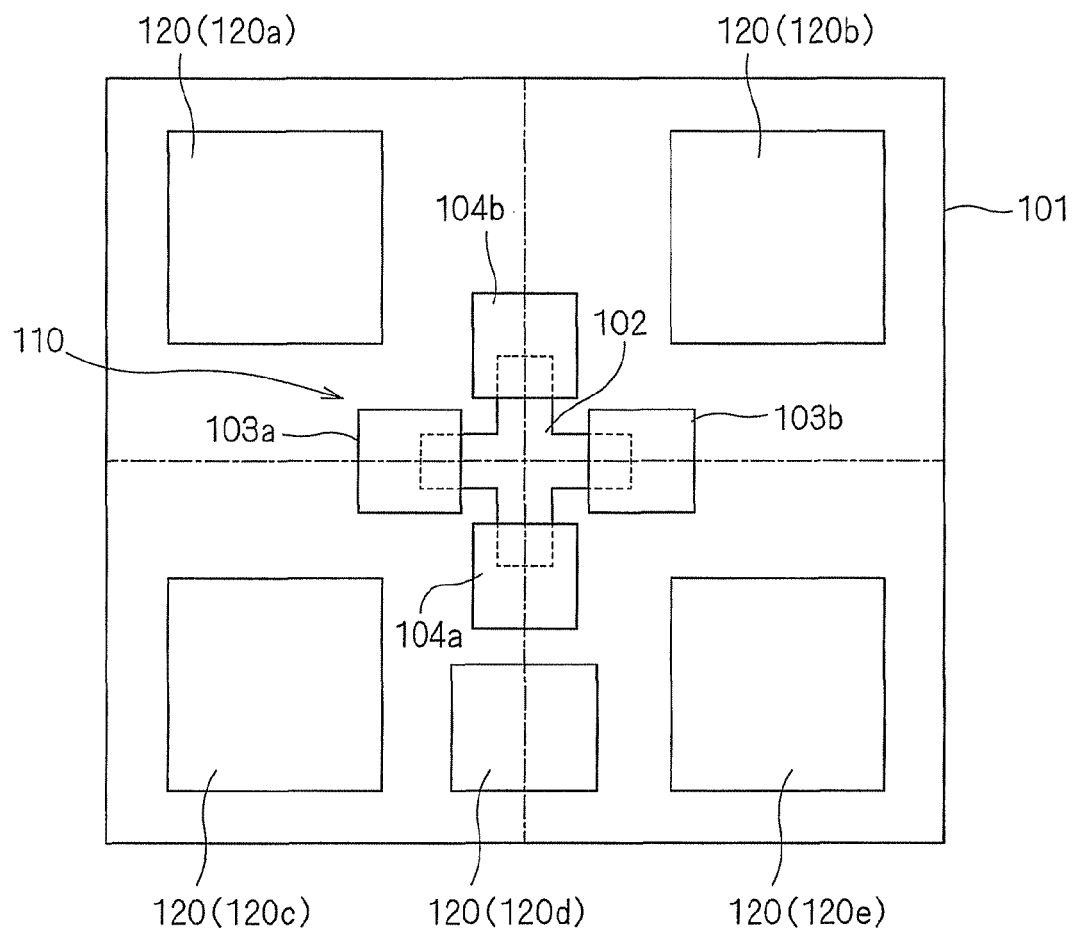
FIG. 15 is a top view showing a conceptual configuration of the Hall IC 100 of to the third embodiment.

FIG. 14 is a side view showing a conceptual configuration of a Hall IC 100 according to the third embodiment. FIG. 15 is a top view showing a conceptual configuration of the Hall IC 100 according to the third embodiment. In the Hall IC 100 shown in FIGS. 14 and 15, the components are disposed by way of example for the purpose of easy understanding, and FIGS. 14 and 15 do not show the same Hall IC 100 from different directions.

Roughly, the Hall IC 100 comprises a Hall element part 110 and a plurality of HEMT parts 120 (two HEMT parts are illustrated in FIG. 14, and five HEMT parts are illustrated in FIG. 15). The Hall element part 110 and the HEMT part 120 have a common substrate 101, and operating layers 102 are formed so as to have a common composition. The substrate 101 is similar to the substrate 1 of the Hall element 10 according to the second embodiment.

The Hall element part 110, exclusively focused on this part, has the configuration similar to that of the Hall element 20 according to the second embodiment. That is, the operating layer 102 including a first layer 102a and a second layer 102b is formed on the substrate 101, and two input electrodes 103a and 103b and two output electrodes 104a and 104b are provided on the operating layer 102. The operating layer 102 is formed so as to have the cross shape when the Hall element part 110 is viewed from above. Although shown in the simplified manner in FIG. 14, it is assumed that each electrode is formed such that each end portion of the cross shape of the operating layer 2 is coated therewith like the Hall element 20 according to the second embodiment (that is, like the Hall element 10 according to the first embodiment).

In the Hall element part 110 having the above-described configuration, the heterojunction interface is formed between the first layer 102a and the second layer 102b, and the two-dimensional electron gas region formed near the heterojunction interface in the first layer 102a constitutes a carrier moving region. Similarly to the first layer 2a of the Hall element 20 according to the second embodiment, the first layer 102a is formed as the high resistance layer made of GaN whose specific resistance is not lower than $1 \times 10^6$ Ωcm (electron concentration is not more than $1 \times 10^{12}/cm^3$). The second layer 102b is formed as the layer made of $Al_xGa_{1-x}N$ ($0 < x \leq 0.3$). Therefore, the measurement sensitivity similar to that of the Hall element 20 according to the second embodiment is realized in the Hall element part 110.

On the other hand, the HEMT part 120, exclusively focused on this part, has a configuration of a so-called HEMT. Specifically, the operating layer 102 including the first layer 102a and second layer 102b is formed on the substrate 101, thereby forming the heterojunction interface between the first layer 102a and the second layer 102b. The first layer 102a is formed as the high resistance layer made of GaN whose specific resistance is not lower than $1 \times 10^6$ Ωcm (electron concentration is not more than $1 \times 10^{12}/cm^3$), and the second layer 102b is made of $Al_xGa_{1-x}N$ ($0 < x \leq 0.3$). Additionally, a gate electrode 105, a source electrode 106, and a drain electrode 107 are provided on the operating layer 102. Therefore, there is realized the HEMT element structure in which the two-dimensional electron gas region formed near the heterojunction interface in the first layer 102a constitutes the carrier moving region.

More specifically, the plurality of HEMT parts 120 is provided in the Hall IC 100 so as to have different functions. In FIG. 15, a signal processing IC part 120a, a constant-current bias generating circuit part 120b, a comparator circuit part 120c, an offset compensation circuit part 120d, and an amplifying circuit part 120e are provided in the Hall IC 100, and each unit is formed by the HEMT part 120. However, a temperature compensation circuit part which is provided in the conventional Hall element in order to compensate a characteristic shift when used at a high temperature is not provided. Because a well-known technique can be applied to the detailed circuit configuration of each circuit part, the description thereof will be omitted.

The constant-current bias generating circuit part 120b and the input electrodes 103a and 103b of the Hall element part 110 are connected by an Al interconnection (not shown), and the output electrodes 104a and 104b of the Hall element part 110 and the amplifying circuit part 120e are connected by the Al interconnection (not shown). Therefore, the Hall IC 100 is formed as a monolithic-type Hall IC which supplies a digital signal.

Similarly to the formation of the laminated structure 5 prepared for the fabrication of the Hall element 20 according to the second embodiment, the first layer 102a and the second layer 102b are formed on the substrate 101 by the epitaxial growth, a groove part 108 which acts as an element isolating part while forming the operating layer 102 into the cross shape is provided by the photolithography process and RIE technique, and the electrodes are formed in each part by the photolithography process and EB evaporation, thereby realizing the Hall IC 100. At this point, similarly to the first layer 2a of the Hall element 20 according to the second embodiment, because the first layer 102a is formed as the high resistance layer made of GaN whose specific resistance is not lower than $1 \times 10^6$ Ωcm (electron concentration is not more than $1 \times 10^{12}/cm^3$), the groove part 108 can be formed so that the depth (etching depth) of the groove part 108 is smaller than the thickness of the operating layer 2. Specifically, it is preferable that the groove part 108 is formed with the depth of tens nanometers, for example, 60 nm. Preferably, the input electrodes 103a and 103b and output electrodes 104a and 104b of the Hall element part 110 and the source electrode 106 and drain electrode 107 of the HEMT part 120 are provided as a multi-layer electrode of Ti/Al/Ni/Au. These electrodes can collectively be formed in the one-time process. Preferably, the gate electrode 105 is provided as a multi-layer electrode of Ni/Au.

For example, in the Hall IC 100, the GaN layer having the electron concentration of $5 \times 10^{11}/cm^3$ is formed as the first layer 102a with the thickness of 2 μm, the $Al_{0.2}Ga_{0.8}N$ layer is formed as the second layer 102b with the thickness of 25 nm, and the depth of the groove part 108 is set at 60 nm. In this case, when the rate of change of temperature about magnetic flux density of high/low switching operation is measured while the Hall IC 100 is heated from room temperature to 400° C., the result of the rate of change of temperature is −0.01%/° C. The result shows that the Hall IC 100 is operated with the same measurement sensitivity in a range from room temperature to at least 400° C.

Thus, according to the third embodiment, the Hall IC is constituted to include the Hall element part and the IC part formed by HEMT, each having the common laminated structure, by forming the groove part which acts as the element isolating part while partitioning the cross-shape portion of the operating layer of the Hall element on the laminated structure of the high resistance layer made of GaN whose specific resistance is not lower than $1 \times 10^6$ Ωcm (electron concentration is not more than $1 \times 10^{12}/cm^3$) at room temperature and the layer made of $Al_xGa_{1-x}N$ (0<x≦0.3), so that there is realized the Hall IC which is stably operated in a range from room temperature to a high temperature without providing the temperature compensation circuit part.

Fourth Embodiment

A magnetoresistive effect element which is of the magnetic sensor being able to detect the magnetic field utilizing a semiconductor magnetoresistive effect will be described in a fourth embodiment.

Figure 16:
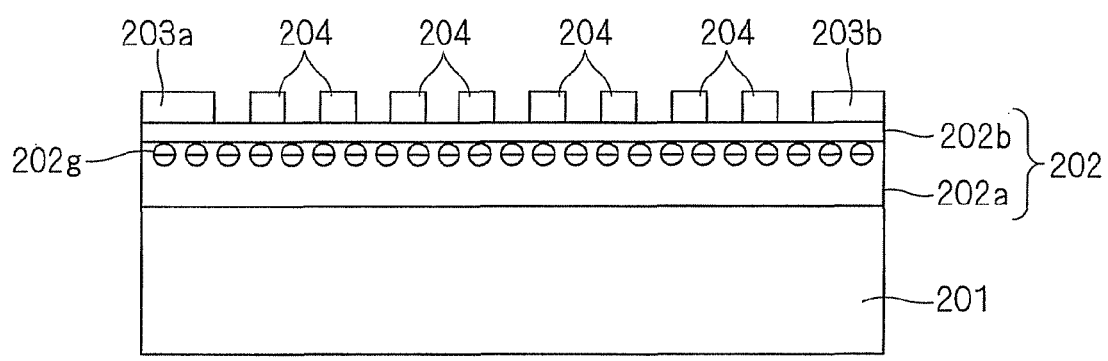
FIG. 16 is a sectional view showing a configuration of a magnetoresistive effect element 200 according to a fourth embodiment of the present invention.

FIG. 16 is a sectional view showing a configuration of a magnetoresistive effect element 200 according to the fourth embodiment. The magnetoresistive effect element 200 includes a substrate 201, an operating layer 202, two terminal electrodes 203a and 203b, and a number of short-circuit electrodes 204. The operating layer 202 is formed by a first layer 202a and a second layer 202b, and the first layer 202a and the second layer 202b are formed on the substrate 201. The two terminal electrodes 203a and 203b are formed on the surface of the operating layer 202. The number of short-circuit electrodes 204 are formed between the two terminal electrodes 203a and 203b.

A change in resistance generated between the two terminal electrodes 203a and 203b is measured while the magnetoresistive effect element 200 is placed in the perpendicular magnetic field from the surface toward the backside of the magnetoresistive effect element 200, which allows the magnetic flux density of the magnetic field to be obtained.

The substrate 201 is identical to the substrate 1 of the Hall element 10 according to the first embodiment. The operating layer 202 is formed in the same way as the operating layer 2 of the Hall element 10 according to the first embodiment. That is, the first layer 202a is formed as the layer made of GaN whose electron concentration is not more than $1 \times 10^{16}/cm^3$ at room temperature, and the second layer 202b is formed as the layer made of $Al_xGa_{1-x}N$ (0<x≦0.3).

Preferably the terminal electrodes 203a and 203b and the short-circuit electrodes 204 are provided as a multi-layer electrode of Ti/Al/Ni/Au. These electrodes can be formed by adopting the photolithography process and EB evaporation technique.

The formation of the operating layer 202 as described above is identical to the fabrication of the laminated structure 5 used to form the Hall element 10 in the first embodiment. Accordingly, in the magnetoresistive effect element 200 according to this embodiment, similarly to the Hall element 10 according to the first embodiment, the heterojunction interface is formed between the first layer 202a and the second layer 202b in the operating layer 202, and a two-dimensional electron gas region 202g formed near the heterojunction interface in the second layer 202b constitutes the carrier moving region in the magnetoresistive effect element 200.

Therefore, in the magnetoresistive effect element 200, the two-dimensional electron gas region 202g is further thinned (becomes more tow-dimensionally), whereby the carrier mobility is further enhanced in the two-dimensional electron gas region 202g. Because the composition difference between the second layer 2b and the first layer 2a is relatively small, the generation of the two-dimensional electron gas is constrained in the two-dimensional electron gas region 202g, which further reduces the carrier concentration.

Additionally, the magnetoresistive effect element 200 is constituted such that the electron concentration is not more than $1\times10^{16}/cm^3$ at room temperature in the first layer 202*a* and the generation of the two-dimensional electron gas is constrained in the two-dimensional electron gas region 202*g* owing to forming the second layer 202*b* as the AlGaN layer having the small Al mixture proportion. Therefore, the magnetoresistive effect element 200 has the high input and output resistance.

Because the requirement for the operating layer 202 of the magnetoresistive effect element 200 is identical to the requirement for the operating layers 2 of the Hall elements 10 and 20 according to the first and second embodiments, in the case that the operating layer 202 has the same characteristic as the operating layers 2 of the Hall elements 10 and 20 as described above, the high measurement sensitivity is realized in the magnetoresistive effect element 200.

For example, similarly to the Hall element, the AlN layer may be inserted between the first layer 202*a* and the second layer 202*b* in order to further enhance the carrier mobility. Preferably, the AlN layer is formed with the thickness in the range of about 0.75 nm to about 1.5 nm.

That is, similarly to the Hall elements according to the first and second embodiments, the magnetoresistive effect element of the fourth embodiment can be used with the good measurement sensitivity even at a high temperature.

EXAMPLES

Inventive Example 1 and Comparative Example 1

In Inventive Example 1, various Hall elements having the different electron concentrations of the first layer 2*a* and the different Al composition proportions in all the group-III elements in the second layer 2*b* were proposed as the Hall element 10 according to the first embodiment. At the same time, some Hall elements whose first layer 2*a* had the electron concentration higher than that of the Hall element 10 while having the configuration similar to that of the Hall element 10 and some Hall elements whose Al composition proportion in all the group-III elements in the second layer 2*b* was higher than that of the Hall element 10 were produced as Comparative Example 1.

A plurality of two-inch-diameter single-crystal sapphire substrates having plane orientation (0001) were prepared as the substrate 1, and laminated structures 5 were formed on the substrates with the MOCVD apparatus. In the MOCVD apparatus, a group-III raw-material gas supply system and a group-V raw-material gas supply system are separately provided, and both the group-III raw-material gas and the group-V raw-material gas can separately be supplied to the neighborhood of the susceptor along with the carrier gas. TMG and TMA were used as the group-III raw-material gas, and $NH_3$ was used as the group-V raw-material gas. One of or both the hydrogen gas and the nitrogen gas were appropriately used as the carrier gas.

Specifically, each single-crystal substrate was placed on the susceptor in the MOCVD apparatus, and the substrate was heated to 1100° C. to perform a heat treatment (thermal cleaning) for 20 minutes. Then, the substrate temperature was lowered to 500° C. to form the low-temperature buffer layer made of GaN having the thickness of 30 nm.

After the formation of the buffer layer, the substrate was heated to 1000° C., the GaN layer having the thickness of 2 μm was formed as the first layer 2*a*, and the AlGaN layer having the thickness of 25 nm was formed as the second layer 2*b*. In the GaN layer, the electron concentration was set in the range of $1\times10^{12}/cm^3$ to $5\times10^{17}/cm^3$ at room temperature. In the AlGaN layer, the Al composition proportion x in all the group-III elements was set in the range of 0.1 to 0.4. Then, the laminated structure 5 was obtained.

FIG. 17 is a view showing a list of a kind of supply gas and a flow rate in the group-III raw-material gas supply system and the group-V raw-material gas supply system when the laminated structure 5 is formed. In forming the AlGaN layer, a supply flow rate ratio of TMA and TMG was determined based on the composition proportion of Al and Ga in the AlGaN layer to be formed.

In producing the GaN layer whose electron concentration is lower than $1\times10^{15}/cm^3$ at room temperature, the gas containing the nitrogen gas was caused to flow when the substrate 1 was heated prior to the formation of the first layer 2*a*, and a ratio of the hydrogen gas and the nitrogen gas in the whole of the carrier gas was changed to realize various electron concentrations in forming the first layer 2*a*. Specifically, the ratio of the nitrogen gas to the whole of the carrier gas was changed to 0.1 volume percent, 2 volume percent, and 10 volume percent in order that the residual electron concentration in the GaN layer becomes lower.

On the other hand, the GaN layer whose electron concentration was not lower than $1\times10^{15}/cm^3$ was formed by doping Si into the GaN layer. Specifically, in forming the GaN layer by MOCVD, a $SiH_4$ gas was introduced, with the flow rate of the $SiH_4$ gas being controlled, such that a dosage corresponding to the desired electron concentration was obtained. And specifically, the gas flow rates were controlled based on the composition proportion of Si and Ga in the n-type GaN layer to be formed. For the GaN layer having the electron concentration of about $1\times10^{15}/cm^3$, the GaN layer was formed without introducing the $SiH_4$ gas.

The electron concentration and specific resistance of the GaN layer were evaluated using specimens which were produced by the similar technique except that the AlGaN layer was formed.

When the laminated structure 5 was obtained, the surface of the laminated structure 5 was etched not lower than 2 μm by the photolithography process and RIE technique so as to form the cross shape in which two lines having the width of 50 μm and the length of 200 μm are orthogonal to each other in the center.

Then, a metal pattern made of Ti/Al/Ni/Au (thicknesses of 25/75/15/100 nm in order) was formed with a size of 100 μm by 100 μm in each front-end portion of the cross shape by the photolithography process and EB evaporation, and an alloying treatment was performed at 850° C. for 30 seconds to for the input electrodes 3*a* and 3*b* and the output electrodes 4*a* and 4*b* using an infrared rapid heating furnace. Then, the Hall element was obtained.

In order to enable characteristic evaluation of the Hall element, a silicon nitride passivation film was formed in the surface by the CVD technique and photolithography process, and a contact hole was made in each electrode portion to perform wire bonding.

Then, an electric characteristic of the Hall element was evaluated. Specifically, in the magnetic field having the magnetic flux density of 500 Gauss, the Hall voltage was measured while the constant driving current of 2 mA or the constant driving voltage of 3V was applied. FIGS. 4 and 5 show the evaluation results.

As shown in FIG. 4, the higher Hall voltage is obtained, as the electron concentration is increased in the first layer 2*a*, and as the Al composition proportion in all the group-III elements is decreased in the second layer 2*b*. As shown in FIG. 5, in the case where the electron concentration is not more than $1\times10^{16}/cm^3$ in the first layer 2a, the high Hall voltage is obtained when the Al composition proportion in all the group-III elements is not more than 0.3 in the second layer 2b.

The rate of change of the Hall voltage to the temperature in the constant-current drive operation was also evaluated while the Hall element was heated from room temperature to 800° C. FIGS. 6 to 11 show the evaluation results.

As can be seen from FIGS. 6 to 11, in the case of the second layer 2b having the same composition, the Hall voltage is substantially kept constant (rate of change of temperature ranges from –0.01 to 0%/° C.) up to at least 800° C. when the electron concentration is not more than $1\times10^{16}/cm^3$ in the first layer 2a.

Thus, it was confirmed by Inventive Example 1 and Comparative Example 1 that the electron concentration is set not more than $1\times10^{16}/cm^3$ in the first layer 2a made of GaN while the Al composition proportion in all the group-III elements is set not more than 0.3 in the second layer 2b, thereby realizing the Hall element which can stably be operated by the constant-current drive in the temperature range of room temperature to 800° C., while performing the measurement at room temperature with the high measurement sensitivity in both the constant-current drive and the constant-voltage drive.

Inventive Example 2

In Inventive Example 2, the Hall element 20 according to the second embodiment was formed. The electron concentration was set at $5\times10^{11}/cm^3$ in the GaN layer which is of the first layer 2a. The $Al_{0.2}Ga_{0.8}N$ layer was formed as the second layer 2b. The etching depth was set at 60 nm when the operating layer 2 was formed into the cross shape. Other procedures were similar to those of Inventive Example 1.

Similarly to Inventive Example 1, the characteristic evaluation was performed to the produced Hall element. Specifically, in the magnetic field having the magnetic flux density of 500 Gauss, the Hall voltage was measured while the constant driving current of 2 mA or the constant driving voltage of 3V was applied. The Hall voltage of 6.119 mV was obtained in the constant driving current of 2 mA, and Hall voltage of 23.88 mV was obtained in the constant driving voltage of 3V. These Hall voltage values were substantially equal to the values of the Hall element having the same composition of the AlGaN layer fabricated in Inventive Example 1.

The rate of change of the Hall voltage to the temperature in the constant-current drive operation was also evaluated while the Hall element was heated from room temperature to 800° C. The evaluation result was 0.0005%/° C. That is, similarly to the Hall element fabricated in Inventive Example 1, it was found that the Hall voltage was substantially kept constant up to at least 800° C.

The results show that the Hall element in which the etching depth in forming the cross shape of the operating layer 2 is set shallower compared with Inventive Example 1 has the measurement sensitivity similar to that of the Hall element of Inventive Example 1.

Inventive Example 3

In Inventive Example 3, the monolithic Hall IC 100 according to the third embodiment was fabricated. At this point, the Hall element part 110 was produced so as to have the configuration similar to that of the Hall element according to Inventive Example 2. The signal processing IC part 120a, the constant-current bias producing circuit part 120b, the comparator circuit part 120c, the offset compensation circuit part 120d, and the amplifying circuit part 120e were formed as the HEMT part 120.

Specifically, two-inch-diameter sapphire substrate having the plane orientation (0001) was used as the substrate 101, and the GaN layer which was of the first layer and the $Al_{0.2}Ga_{0.8}N$ layer which was of the second layer were formed in the same way as Inventive Example 2.

The groove part 108 was formed with the depth of 60 nm by the photolithography process and RIE technique. Therefore, the element isolating part was provided, and the operating layer 102 was formed into the cross shape when viewed from above.

Then, the metal patterns made of Ti/Al/Ni/Au (thicknesses of 25/75/15/100 nm in order) were formed at displacement positions of the input electrodes 103a and 103b and output electrodes 104a and 104b of the Hall element part 110 and at displacement positions of the source electrode 106 and drain electrode 107 of the HEMT part 120 by the photolithography process and EB evaporation technique, and the alloying treatment was performed at 850° C. for 30 seconds to form each electrode using the infrared rapid heating furnace.

The metal pattern made of Ni/Au (thicknesses of 30/100 nm in order) was formed at the displacement position of the gate electrode 105 of the HEMT part 120 to form the gate electrode 105 by the photolithography process and EB evaporation technique.

Then, the constant-current bias producing circuit part 120b and the input electrodes 103a and 103b of the Hall part 110 were connected by the Al interconnection (not shown), and the output electrodes 104a and 104b of the Hall part 110 and the amplifying circuit part 120e were connected by the Al interconnection (not shown). Then, the Hall IC 100 was obtained.

The rate of change about magnetic flux density of the high/low switching operation to the temperature was measured in the range from room temperature to 400° C. for the obtained Hall IC 100. The result of the rate of change of temperature was –0.01%/° C. was obtained. The result shows that the Hall IC operated with the same measurement sensitivity in the range from room temperature to at least 400° C. without providing the temperature compensation circuit part is obtained.

While the invention has been shown and described in detail, the foregoing description is in all aspects illustrative and not restrictive. It is therefore understood that numerous modifications and variations can be devised without departing from the scope of the invention.

What is claimed is:
1. A Hall element comprising:
a GaN layer whose electron concentration is not more than $1\times10^{12}/cm^3$;
an AlGaN layer formed on said GaN layer by $Al_xGa_{1-x}N$ ($0<x\leq0.3$);
two input electrodes; and
two output electrodes, wherein said GaN layer and said AlGaN layer constitute an operating layer having a heterojunction structure, said two input electrodes are comprised on each of first end portions of said operating layer, said each of first end portions being opposite to each other when said operating layer is viewed from above, and said two output electrodes are comprised on each of second end portions of said operating layer, said each of second end portions being opposite to each other in a direction substantially orthogonal to a direction connecting said each of first end portions.

2. The Hall element according to claim 1, wherein said operating layer has a cross-shape portion when viewed from above, said two input electrodes are comprised on each of two first front-end portions of said cross-shape portion, said each of two first front-end portions being opposite to each other, and said two output electrodes are comprised on each of two second front-end portions, said each of two second front-end portions being different from said first front-end portions.

3. The Hall element according to claim 1, wherein a specific resistance of said GaN layer is not lower than $1 \times 10^6$ Ωcm.

4. The Hall element according to claim 3, wherein a height of said cross-shape portion is larger than a thickness of said AlGaN layer, and said height of said cross-shape portion is smaller than a thickness of a whole of said operating layer.

5. The Hall element according to claim 1, wherein a height of said cross-shape portion is larger than a thickness of said AlGaN layer, and said height of said cross-shape portion is smaller than a thickness of a whole of said operating layer.

6. The Hall element according to claim 1, further comprising:

an AlN layer which has a thickness of 0.75 nm to 1.5 nm, said AlN layer being inserted into a junction interface between said AlGaN layer and said GaN layer.

7. A Hall IC comprising:
(a) a substrate;
(b) a Hall element including;
(b-1) a GaN layer which is formed on said substrate, an electron concentration of said GaN layer being not more than $1 \times 10^{12}/cm^3$, a specific resistance of said GaN layer being not lower than $1 \times 10^6$ Ωcm,
(b-2) an AlGaN layer formed on said GaN layer by $Al_xGa_{1-x}N(0<x\leq0.3)$,
(b-3) two input electrodes, and
(b-4) two output electrodes; and
(c) a control circuit which is formed on said substrate while including HEMT, wherein said GaN layer and said AlGaN layer constitute an operating layer having a heterojunction structure, said two input electrodes are comprised on each of first end portions of said operating layer, said each of first end portions being opposite to each other when said operating layer is viewed from above, and said two output electrodes are comprised on each of second end portions of said operating layer, said each of second end portions being opposite to each other in a direction substantially orthogonal to a direction connecting said each of first end portions.

8. A magnetoresistive effect element comprising:
a GaN layer whose electron concentration is not more than $1 \times 10^{16}/cm^3$;
an AlGaN layer which is formed by $Al_xGa_{1-x}N(0<x\leq0.3)$;
two terminal electrodes; and
a plurality of short-circuit electrodes, wherein said GaN layer and said AlGaN layer constitute an operating layer having a heterojunction structure, said two terminal electrodes are comprised on each of end portions being opposite to each other on a surface of said operating layer, and said plurality of short-circuit electrodes are comprised between said two terminal electrodes.

9. The magnetoresistive effect element according to claim 8, further comprising:

an AlN layer which has a thickness of 0.75 nm to 1.5 nm, said AlN layer being inserted into a junction interface between said AlGaN layer and said GaN layer.

10. A method of fabricating a Hall element, comprising steps of:

(a) forming an operating layer having a heterojunction structure between a GaN layer and an AlGaN layer, including steps of;

(a-1) epitaxially forming said GaN layer whose electron concentration is not more than $1 \times 10^{12}/cm^3$ on a predetermined substrate, and (a-2) epitaxially forming said AlGaN layer made of $Al_xGa_{1-x}N(0<x\leq0.3)$ on said GaN layer; and (b) forming input electrodes on each of first end portions of said operating layer and of forming output electrodes on each of second end portions, said first end portions being opposite to each other when said operating layer is viewed from above, said second end portions being opposite to each other in a direction substantially orthogonal to a direction connecting said each of first end portions.

11. The method of fabricating the Hall element according to claim 10, wherein said step (a) further comprises a step of:

(a-3) removing a part of said operating layer to form a cross-shape portion on said operating layer, said cross-shape portion having a cross shape when said operating layer is viewed from above, and in said step (b), said input electrodes are formed on each of two first front-end portions of said cross-shape portion, said first front-end portions being opposite to each other, and said output electrodes are formed on each of two second front-end portions, said second front-end portions being different from said first front-end portions.

12. The method of fabricating the Hall element according to claim 11, wherein said GaN layer is formed in said step (a-1) such that a specific resistance is not lower than $1 \times 10^6$ Ωcm, and said cross-shape portion is formed in said step (a-3) such that a height of said cross-shape portion is larger than a thickness of said AlGaN and such that said height of said cross-shape portion is smaller than a thickness of a whole of said operating layer.

13. The method of fabricating the Hall element according to claim 10, wherein a following step is inserted between said step (a-1) and said step (a-2);

(a-3) forming an AlN layer having a thickness of 0.75 nm to 1.5 nm.

14. A method of fabricating a magnetoresistive effect element comprising steps of:

(a) forming an operating layer having a heterojunction structure between a GaN layer and an AlGaN layer, including steps of;
(a-1) epitaxially forming said GaN layer whose electron concentration is not more than $1\times10^{16}/cm^3$ on a predetermined substrate, and
(a-2) epitaxially forming said AlGaN layer made of $Al_xGa_{1-x}N(0<x\leqq0.3)$ on said GaN layer; and
(b) forming terminal electrodes on each of end portions on a surface of said operating layer, said end portions being opposite to each other, and of forming a plurality of short-circuit electrodes between said terminal electrodes.

15. The method of fabricating the magnetoresistive effect element according to claim 14, wherein a following step is inserted between said step (a-1) and said step (a-2);
(a-3) a process of forming an AlN layer having a thickness of 0.75 nm to 1.5 nm.

* * * * *